(12) United States Patent
Quiquempoix

(10) Patent No.: US 12,278,652 B2
(45) Date of Patent: Apr. 15, 2025

(54) SYSTEM AND METHODS FOR SIGMA-DELTA MODULATION

(71) Applicant: Microchip Technology Incorporated, Chandler, AZ (US)

(72) Inventor: Vincent Quiquempoix, Divonne-les-Bains (FR)

(73) Assignee: Microchip Technology Incorporated, Chandler, AZ (US)

( * ) Notice: Subject to any disclaimer, the term of this patent is extended or adjusted under 35 U.S.C. 154(b) by 189 days.

(21) Appl. No.: 18/129,991

(22) Filed: Apr. 3, 2023

(65) Prior Publication Data
US 2024/0333301 A1    Oct. 3, 2024

(51) Int. Cl.
*H03M 3/00*    (2006.01)

(52) U.S. Cl.
CPC ........... *H03M 3/352* (2013.01); *H03M 3/376* (2013.01)

(58) Field of Classification Search
CPC ...... H03M 3/452; H03M 3/376; H03M 3/364; H03M 3/352; H03M 3/00
See application file for complete search history.

(56) References Cited

U.S. PATENT DOCUMENTS

| | | | | |
|---|---|---|---|---|
| 6,107,947 A | * | 8/2000 | Lyden | H03M 3/466 341/200 |
| 7,123,177 B2 | * | 10/2006 | Cheng | H03M 3/444 341/161 |
| 8,736,473 B2 | * | 5/2014 | Dijkmans | H03M 3/434 341/143 |
| 2002/0030618 A1 | * | 3/2002 | Cusinato | H03M 3/364 341/143 |
| 2005/0007267 A1 | * | 1/2005 | Zogakis | H03M 7/3011 341/143 |
| 2008/0074303 A1 | * | 3/2008 | Rueger | H03M 3/39 341/143 |
| 2012/0038500 A1 | * | 2/2012 | Dijkmans | H03M 3/434 341/143 |
| 2012/0319881 A1 | * | 12/2012 | Huang | H03M 3/438 341/143 |
| 2016/0197619 A1 | * | 7/2016 | Katayama | H03M 3/30 341/143 |
| 2017/0041019 A1 | * | 2/2017 | Miglani | H03M 1/0626 |
| 2019/0326925 A1 | * | 10/2019 | Kauffman | H03M 1/0607 |
| 2021/0305995 A1 | * | 9/2021 | Wang | H03M 3/402 |
| 2022/0109452 A1 | * | 4/2022 | Gupta | H03M 3/464 |

OTHER PUBLICATIONS

International Search Report and Written Opinion, Application No. PCT/US2023/034345, 14 pages, Jan. 15, 2024.

\* cited by examiner

*Primary Examiner* — Lam T Mai
(74) *Attorney, Agent, or Firm* — SLAYDEN GRUBERT BEARD PLLC

(57) ABSTRACT

A device and method for sigma-delta modulation may include an input signal and a plurality of integrators. The output of the integrators and a data input may be input to an adder, the sum output to be input to a quantizer to generate a quantized output signal. A reset input to the first integrator may be asserted during a first sample of the quantized output signal to reduce the signal discontinuity at the input of the first integrator, which improves the stability of the sigma-delta modulator.

5 Claims, 3 Drawing Sheets

SYSTEM AND METHODS FOR SIGMA-DELTA MODULATION

FIELD OF THE INVENTION

The present disclosure relates to systems and methods for sigma-delta modulation, specifically for improving stability performance in sigma-delta modulators.

BACKGROUND

Incremental sigma-delta analog-to-digital converters (ADCs) are oversampled converters that can be powered on and off on demand, and are not necessarily running continuously in an application. When an incremental sigma-delta converter is enabled, a large transient may be present at the input. Since sigma-delta converters contain a sigma-delta modulator and a highly non-linear quantizer in a feedback loop, the stability of these converters on startup may be problematic. For first order loops, the stability is inherently guaranteed up to the full dynamic range, but for higher order loops, the stability can only be guaranteed by reducing the input level, which comes at the expense of overall signal-to-noise ratio.

An incremental ADC may be powered on with a constant input, and this constant input is seen at startup as a step function at the input, causing an impulse at the input of the first integrator, which can cause the modulator to become unstable. This step function at the input contains high frequency content which can destabilize the system. The reset state of the converter integrators and storage elements is typically maintained at 0 internally and the first feedback is also often maintained at 0 because there is no information on the input signal to the device. Therefore, if a large constant input is applied at power up, the step function is large while the feedback is at zero, which may cause instability.

To prevent this instability, previous solutions may include a gain setting at the input to lower the gain of the modulator. However this solution reduces signal to noise ratio (SNR) of the device, which is a key performance metric in incremental sigma-delta converters.

There exists a need to improve stability in incremental sigma-delta modulators while preserving the SNR of the incremental sigma-delta modulator.

SUMMARY

According to one aspect, there is provided a device including an input adder with a positive input coupled to an input signal and a negative input coupled to a feedback signal, a first integrator with a data input coupled to the output of the input adder and a reset input coupled to an output of a reset circuit, a plurality of downstream integrators, each downstream integrator comprising a data input and a reset input, wherein the data inputs of the plurality of downstream integrators are connected in series, wherein the input of the first of the plurality of downstream integrators is coupled to the output of the first integrator, and wherein the plurality of downstream integrators comprises a last integrator and wherein the reset input of the plurality of downstream integrators are respectively coupled to an output of the reset circuit, an output adder with inputs coupled, respectively, to the output of the first integrator, to the output of one or more of the plurality of downstream integrators, and to an output of a feedforward path, the feedforward path comprising a gain stage coupled between the input signal and the output adder, a quantizer with an input coupled to the output of the output adder, the quantizer to generate a quantized output signal, a digital-to-analog converter with an input coupled to the quantized output signal and an output comprising the feedback signal, and wherein the reset circuit to generate a first reset signal to be coupled to the reset input of the first integrator and one or more second reset signals to be coupled to the reset inputs of, respectively, the plurality of downstream integrators, the first reset signal the second reset signal to be de-asserted at different times.

According to one aspect, a method is enabled including subtracting a feedback signal from an input signal at an input adder to generate a difference signal, integrating the difference signal in a plurality of integrator stages, the plurality of integrator stages comprising a first integrator and one or more downstream integrators, wherein the integrator stages are connected in series and wherein the de-assertion of a reset signal to the first integrator is prior to the de-assertion of a reset signal to the downstream integrators, quantizing, at a quantizer, the sum of, respectively, the output of at least one of the plurality of integrator stages and the input signal, the output of the quantizer comprising a quantized output signal, and converting the quantized output signal into the feedback signal in a digital-to-analog converter.

BRIEF DESCRIPTION OF THE DRAWINGS

The figures illustrate example circuits and systems for a sigma-delta data converter.

DETAILED DESCRIPTION

Figure 1:
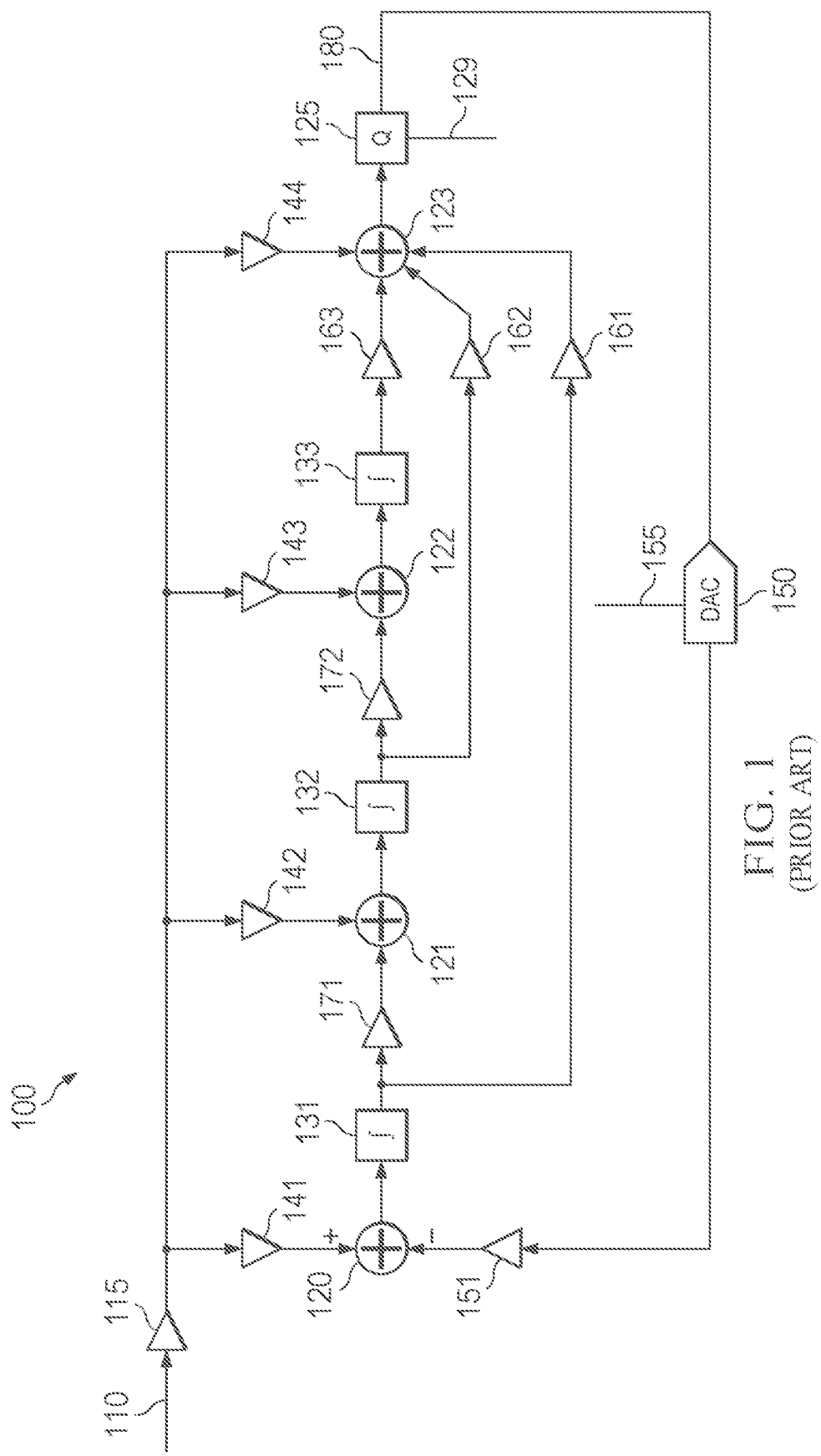
FIG. 1 illustrates a sigma-delta data converter according to the prior art.

FIG. 1 illustrates a sigma-delta modulator architecture 100 according to the prior art. Input signal 110 may be input to the modulator 100. In this exemplary embodiment, the modulator is of the third order. The modulator architecture may be a feedforward architecture as illustrated in FIG. 1 or a feedback architecture. A gain stage 115 may introduce a gain setting with a value of a positive number, which value may be multiplied by the input signal 110.

Quantizer 125 may quantize the output of adder 123 to generate quantizer output 180. Quantizer output 180 may be input to digital-to-analog converter (DAC) 150, and the output of DAC 150 may be fed back to gain stage 151. Gain stage 151 may be coupled between DAC 150 and input adder 120. Gain stages 141, 142, 143 and 144 may be coupled to the output of gain stage 115 and may, respectively, apply a gain setting to the output of gain stage 115 and, respectively, couple to the inputs to the first input of input adder 120, and adders 121, 122 and 123. Gain stages 141, 142, 143, and 144 may respectively multiply the output of gain stage 115 by a specific gain setting to enable a specific modulator transfer function at quantizer output 180. Gain stages 141, 142, 143 and 144 may respectively multiply the output of gain stage 115 by a different gain setting. Gain stages 141, 142, 143 and 144 may respectively multiply the output of gain stage 115 by the same gain setting. Gain stages 141, 142, 143 and 144 may respectively multiply the output of gain stage 115 by a gain setting greater than zero or less than zero or equal to zero.

First integrator 131 may integrate the output of input adder 120. First integrator 131 may integrate the output of input adder 120 using one of various circuit architectures, including but not limited to a switched-capacitor architecture. The output of first integrator 131 may be input to gain stages 161 and 171. Gain stages 161 and 171 may apply a specific gain setting to implement a specific modulator transfer function at quantizer output 180. The output of gain stage 171 may be input to the second input of adder 121.

Second integrator 132 may integrate the output of adder 121. Second integrator 132 may integrate the output of adder 121 using one of various circuit architectures, including but not limited to a switched-capacitor architecture. The output of second integrator 132 may be input to gain stages 162 and 172. Gain stages 162 and 172 may apply a specific gain setting to implement a specific modulator transfer function at quantizer output 180. The output of gain stage 172 may be input to the second input of adder 122.

Third integrator 133 may integrate the output of adder 122. Third integrator 133 may integrate the output of adder 122 using one of various circuit architectures, including but not limited to a switched-capacitor architecture. The output of third integrator 133 may be input to gain stage 163. Gain stage 163 may apply a specific gain setting to implement a specific modulator transfer function at quantizer output 180. The output of gain stage 163 may be input to the second input of adder 123.

Adder 123 may sum the outputs of gain stages 161, 162, 163 and 144. The output of adder 123 may be input to quantizer 125. Quantizer 125 may quantize the signal to a discrete number of levels, the number of levels being greater than or equal to two. Quantizer 125 may include sampling circuitry to sample the input of quantizer 125 at a predetermined time, based on input clock signal 129.

DAC 150 may convert quantizer output 180 to an analog signal. DAC 150 may be implemented using one of various converter architectures, including but not limited to resistor-ladders, segmented converters, a set of parallel switches connected to sampling capacitors, or other architectures not specifically disclosed in this specification. DAC 150 may scale the output of the DAC based on a reference voltage 155. A positive full-scale quantizer output 180 may generate an output at DAC 150 equal to reference voltage 155. A half-scale quantizer output 180 may generate an output at DAC 150 equal to one-half reference voltage 155. A negative full-scale quantizer output 180 may generate an output at DAC 150 equal to a negative polarity voltage equal to reference voltage 155. A negative half-scale quantizer output 180 may generate an output at DAC 150 equal to a negative polarity voltage equal to one-half reference voltage 155. DAC 150 may generate other analog output levels in a similar manner.

In operation, sigma-delta modulator architecture 100 may produce instability for high signal levels of input signal 110. As one of various examples, a square wave input equal in amplitude to reference voltage 155 may result in overall loop instability. For purposes of this discussion, a square wave input equal in amplitude to reference voltage 155 may be termed a full-scale input. When the full-scale square wave is first applied at input signal 110, a full-scale input may appear at the first input of input adder 120. The output of DAC 150 may be zero, such that the input at first integrator 131 may be a full-scale step function. Such a high amplitude input signal may cause first integrator 131 to become unstable. Gain stage 115 may be utilized to introduce an attenuation of the signal in order to prevent such instability. By reducing the signal, the overall signal-to-noise ratio of the converter is reduced, which is not a desirable outcome.

Figure 2:
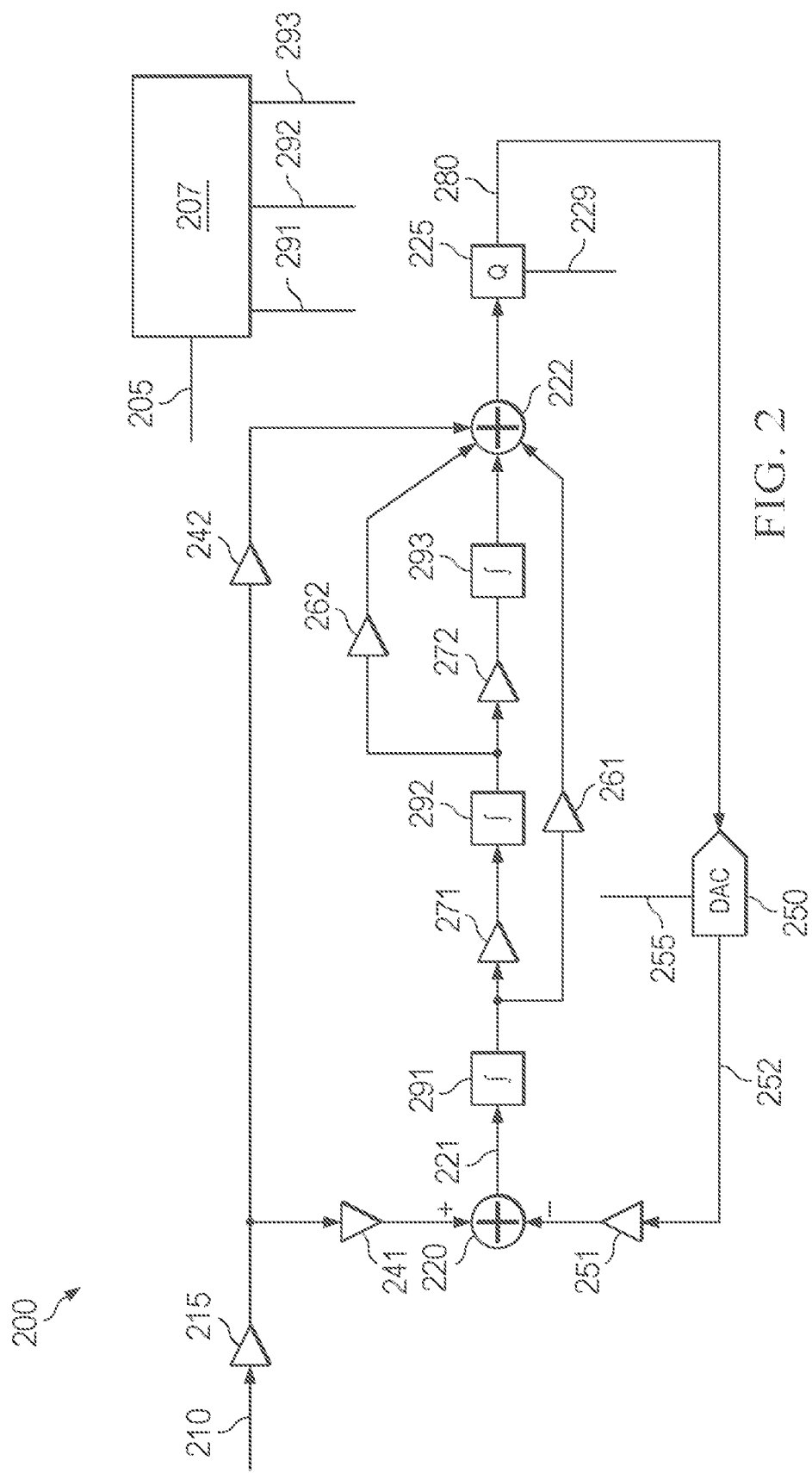
FIG. 2 illustrates one of various examples of a circuit for improving stability in an incremental sigma-delta modulator.

FIG. 2 illustrates one of various examples of a sigma-delta modulator 200. Sigma-delta modulator 200 may be part of an incremental sigma-delta data converter. A reset signal 205 may be input to reset controller circuit 207. Reset controller circuit 207 may generate reset signals for individual components of sigma-delta modulator 200. Reset controller circuit 207 may generate reset signals 291, 292, 293. Sigma-delta modulator 200 may modulate analog input signal 210 to generate a quantizer modulator output 280.

Analog input signal 210 may be input to sigma-delta modulator 200. A gain stage 215 may introduce a gain setting.

The output of gain stage 215 may be input to gain stages 241 and 242. The gain at gain stages 241 and 242 may apply a respective gain setting to implement a specific modulator transfer function at modulator output 280. Gain stage 242 may comprise a feed-forward path to couple input signal 210 directly to output adder 222 through gain stages 215 and 242. Gain stages 241 and 242 may apply the same gain setting or may apply different gain settings.

Input adder 220 may have a first positive input coupled to the output of gain stage 241, and a first negative input coupled to the output of gain stage 251. The output 221 of input adder 220 may produce a difference signal. First integrator 231 may integrate the output 221 of input adder 220. First integrator 231 may include reset input 291. First integrator 231 may integrate the output of input adder 220 using one of various circuit architectures, including but not limited to a switched-capacitor architecture. The output of first integrator 231 may be input to gain stages 261 and 271. Gain stages 261 and 271 may apply a respective gain setting to implement a specific modulator transfer function at modulator output 280. The output of gain stage 271 may be input to second integrator 232.

Second integrator 232 may integrate the output of gain stage 271. Second integrator 232 may include reset input 292. Second integrator 232 may integrate the output of gain stage 271 using one of various circuit architectures, including but not limited to a switched-capacitor architecture. The output second integrator 232 may be input to gain stages 262 and 272. Gain stages 262 and 272 may respectively apply a specific gain setting to implement a specific modulator transfer function at modulator output 280. The output of gain stage 272 may be input to third integrator 233.

Third integrator 233 may integrate the output of gain stage 272. Third integrator 233 may include reset input 293. Third integrator 233 may integrate the output of output adder 222 using one of various circuit architectures, including but not limited to a switched-capacitor architecture. The output of third integrator 233 may be input to output adder 222.

Output adder 222 may sum, respectively, the outputs of gain stages 261 and 262, provided to first and second input of output adder 222, respectively, the output of adder gain stage 242 provided to a third input of output adder 222 and the output of third integrator 233 provided to a fourth input of output adder 222. The output of output adder 222 may be input to quantizer 225.

Quantizer 225 may quantize the signal at the output of output adder 222 to a discrete number of levels, the number of levels being greater than or equal to two. The output of quantizer 225 may be modulator output 280. Quantizer 225 may include sampling circuitry to sample the input of quantizer 225 at a predetermined time, based at least on clock signal 229. Sampling circuitry may include clock generation logic to generate multiphase clocks for sampling, transferring and latching quantizer data.

The modulator illustrated in FIG. 2 includes a first integrator 231, and two downstream integrators, namely second integrator 232 and third integrator 233. Other examples may include more downstream integrators than the number of downstream integrators illustrated in FIG. 2 and other examples may include fewer downstream integrators than the number of downstream integrators illustrated in FIG. 2.

DAC 250 may convert the modulator output 280, provided at the output of quantizer 225, to an analog signal. Output of DAC 250 may comprise feedback signal 252. DAC 250 may be implemented using one of various converter architectures, including but not limited to resistor-ladders, segmented converters or other architectures not specifically disclosed in this specification. DAC 250 may scale the output of the DAC based on reference voltage 255. A full-scale positive quantizer output may generate an output at DAC 250 equal to reference voltage 255. A half-scale positive quantizer output may generate an output at DAC 250 equal to one-half reference voltage 255. A full-scale negative quantizer output may generate a negative polarity output at DAC 250 equal in amplitude to reference voltage 255. A half-scale negative quantizer output may generate a negative polarity output at DAC 250 equal in amplitude to one-half reference voltage 255. DAC 250 may generate other output levels in a similar manner.

In operation, reset signals 291, 292 and 293 may be generated by reset controller circuit 207. In one of various examples, modulator reset 205 may be asserted, and reset controller circuit 207 may initially assert reset signals 291, 292 and 293. Upon de-assertion of modulator reset 205, reset controller circuit 207 may de-assert reset signals 292 and 293. Reset signal 291 may remain in the asserted state. After the first sample of modulator output 280, reset signal 291 may be de-asserted. During the first sample, reset signal 291 may be asserted, and the output of first 231 may be zero. This has the same effect as if the output of gain stage 241 and the output of gain stage 251 were equal. The two equal values would be add to zero at input adder 220, the input to first integrator 231 would be zero, and the output of first integrator 231 would similarly be zero. This is equivalent to the steady state operation of the modulator where the average of the input value is equal to the average of the bitstream value. This match between input and feedback paths forced at the first integrator output by the means of the prolongated reset signal 291 provides a softer start-up of the sigma-delta loop and reduces instability generated by large inputs being integrated at startup without having a feedback sufficient to attenuate them as the feedback is delayed by the downstream integrator delays. In this manner, the timing of resets 291, 292 and 293 may prevent large transients at the input of first integrator 231 and maintain the stability of sigma-delta modulator 200.

Figure 3:
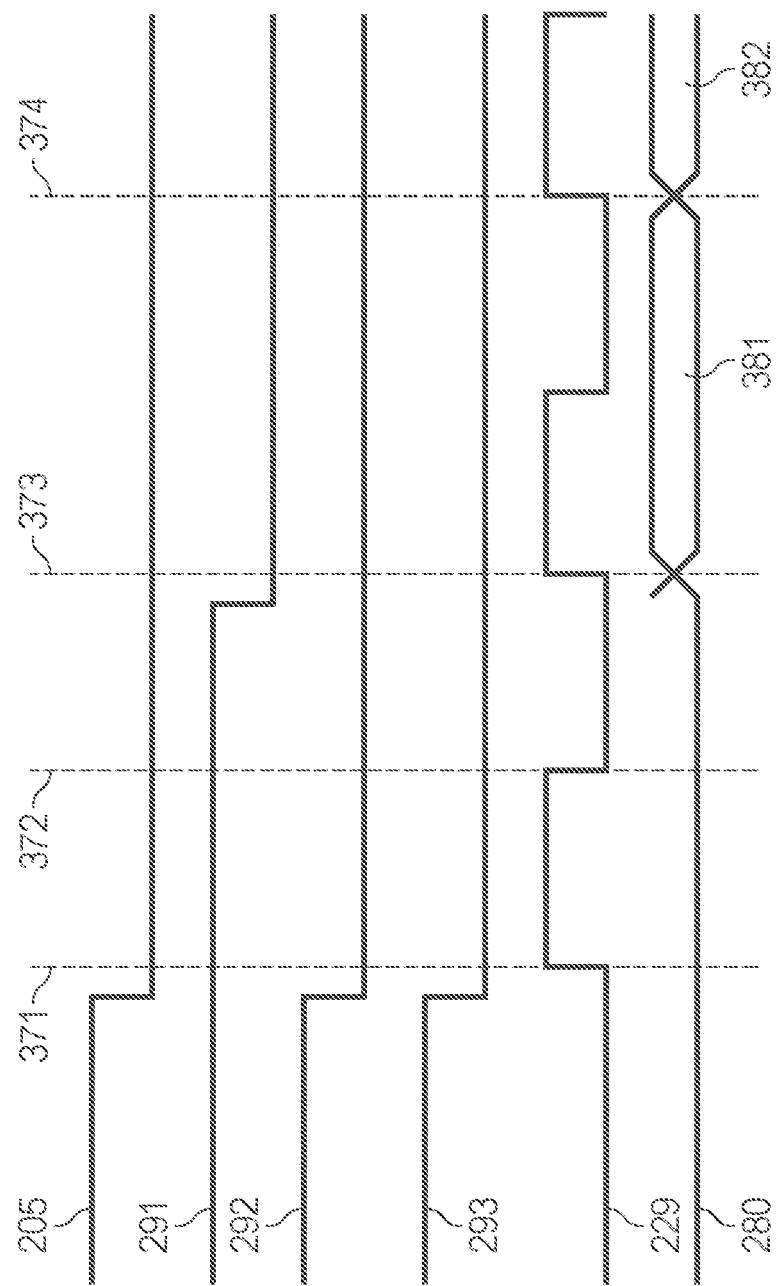
FIG. 3 illustrates a timing diagram of a system for improving stability in an incremental sigma-delta modulator.

FIG. 3 illustrates a timing diagram of operation of one of various examples of a modulator as part of an incremental sigma-delta converter. Respective reset signals illustrated in FIG. 3 may be generated by reset controller circuit 207 of FIG. 2. Labels in FIG. 3 may refer to elements illustrated in FIG. 2.

Reset signal 205 may reset the system when asserted, and release the system to normal operation when de-asserted. Prior to time 371, reset signal 205 may transition from an asserted state to a deasserted state, and the modulator may be released from a reset state. In the example of FIG. 3, reset signal 205 is shown with an active high polarity, but this is not intended to be limiting. Reset signal 205 may have an active low polarity. During the reset state, reset signals 291, 292 and 293 may be asserted and all integrators may be reset to zero. Any capacitors in any sampling circuits may be discharged to zero. Modulator output 280 may be held at zero while reset signal 205 is asserted.

Prior to time 371, reset signal 205 may be de-asserted. After reset signal 205 is de-asserted, reset signals 292 and 293 may be de-asserted. Reset signals 205, 292 and 293 may be de-asserted prior to the rising edge of clock signal 229. First integrator 231 and second integrator 232 may integrate the signal at their respective inputs. In the example illustrated in FIG. 3, two reset signals 292 and 293 are illustrated, but there may be more reset signals than illustrated in FIG. 3, or there may be fewer reset signals than illustrated in FIG. 3. In the examples of FIG. 2 and FIG. 3, a single reset signal may be coupled to a single downstream integrator. In one of various examples, a single reset signal may be coupled to one or more downstream integrators.

After time 372 and prior to time 373, reset signal 291 may be de-asserted by reset controller circuit 207.

At time 373, at the end of the first period of clock signal 229, modulator output 280 may output a first output sample 381.

At time 374, modulator output 280 may output a second output sample 382.

The invention claimed is:

1. A device comprising:
an input adder with a positive input coupled to an input signal and a negative input coupled to a feedback signal;
a first integrator with a data input coupled to an output of the input adder and a reset input coupled to an output of a reset circuit;
a plurality of downstream integrators, each downstream integrator comprising a data input and a reset input, wherein the data inputs of the plurality of downstream integrators are connected in series, wherein the input of the first of the plurality of downstream integrators is coupled to an output of the first integrator, and wherein the plurality of downstream integrators comprises a last integrator and wherein the reset input of the plurality of downstream integrators are respectively coupled to an output of the reset circuit;
an output adder with inputs coupled, respectively, to the output of the first integrator, to the output of one or more of the plurality of downstream integrators, and to an output of a feedforward path, the feedforward path comprising a gain stage coupled between the input signal and the output adder;
a quantizer with an input coupled to the output of the output adder, the quantizer to generate a quantized output signal;
a digital-to-analog converter with an input coupled to the quantized output signal and an output comprising the feedback signal;
wherein the reset circuit to generate a first reset signal to be coupled to the reset input of the first integrator and one or more second reset signals to be coupled to the reset inputs of, respectively, the plurality of downstream integrators, the first reset signal and the second reset signal to be de-asserted at different times, and
the first reset signal to be asserted during a first sample of the quantized output signal and to be de-asserted after the first sample of the quantized output signal.

2. The device as claimed in claim 1, the second reset signal to be de-asserted prior to the first sample of the quantized output signal.

3. The device as claimed in claim 1, the input adder comprising a first gain stage coupled to the positive input and a second gain stage coupled to the negative input.

4. A method comprising:
- subtracting a feedback signal from an input signal at an input adder to generate a difference signal;
- integrating the difference signal in a plurality of integrator stages, the plurality of integrator stages comprising a first integrator and one or more downstream integrators, wherein the integrator stages are connected in series and wherein a de-assertion of a reset signal to the first integrator is prior to the de-assertion of a reset signal to the downstream integrators;
- quantizing, at a quantizer, a sum of, respectively, the output of at least one of the plurality of integrator stages and the input signal, an output of the quantizer comprising a quantized output signal,
- converting the quantized output signal into the feedback signal in a digital-to-analog converter, and wherein
- the reset signal to the first integrator to be asserted during a first sample of the quantized output signal and to be de-asserted after the first sample of the quantized output signal.

5. The method as claimed in claim 4, the reset signal to the downstream integrators be de-asserted prior to the first sample of the quantized output signal.

\* \* \* \* \*